United States Patent [19]

Challa

[11] Patent Number: 5,197,027

[45] Date of Patent: Mar. 23, 1993

[54] SINGLE TRANSISTOR EEPROM ARCHITECTURE

[75] Inventor: Nagesh Challa, Sunnyvale, Calif.

[73] Assignee: Nexcom Technology, Inc., Sunnyvale, Calif.

[21] Appl. No.: 645,507

[22] Filed: Jan. 24, 1991

[51] Int. Cl.$^5$ .............................................. G11C 11/40
[52] U.S. Cl. ...................................... 365/185; 365/51; 365/218; 365/900
[58] Field of Search .............. 365/51, 63, 185, 189.01, 365/218

[56] References Cited

U.S. PATENT DOCUMENTS

| | | | |
|---|---|---|---|
| 4,758,986 | 7/1988 | Kuo . | |
| 4,958,321 | 9/1990 | Chang | 357/185 |
| 4,959,812 | 9/1990 | Momodomi et al. | 365/185 |
| 4,962,481 | 10/1990 | Choi et al. | 365/185 |
| 5,111,430 | 5/1992 | Morie | 365/185 |

FOREIGN PATENT DOCUMENTS 0361972  9/1989  European Pat. Off. .

OTHER PUBLICATIONS

Momodomi, M., et al., "New Device Technologies for 5V-Only 4Mb EEPROM With NAND Gate Structure Cell," *IEEE IEDM* 88, 1988, pp. 412–415.
Article—New Device Technologies for 5V-Only 4Mb EEPROM With NAND Structure Cell by M. Momodomi, et al. from International Electron Devices Meeting, dated 1988.

*Primary Examiner*—Terrell W. Fears
*Attorney, Agent, or Firm*—Thomas E. Schatzel

[57] ABSTRACT

A single-transistor EEPROM device of the present invention comprises memory transistors in banks similar to NAND structures wherein the control gates of the memory transistors have negative voltages applied in various modes that allow reading, writing, and programming regardless of the $V_{th}$ of nonselected memory transistors in a bank. Programming and erasing results from various combinations of negative and positive voltages are used on the select gates together with positive voltages less than that alone which is necessary to induce Fowler-Nordheim tunneling are applied to the bit lines.

19 Claims, 3 Drawing Sheets

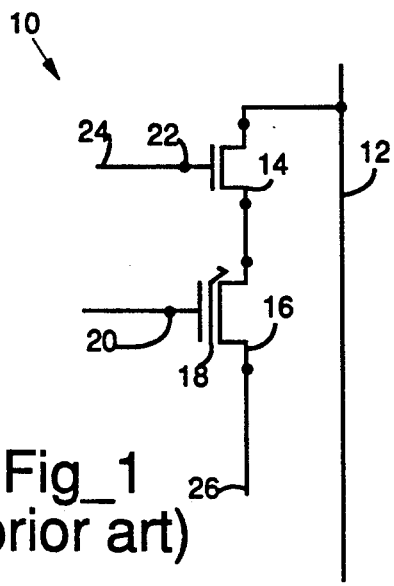
Fig_1
(prior art)
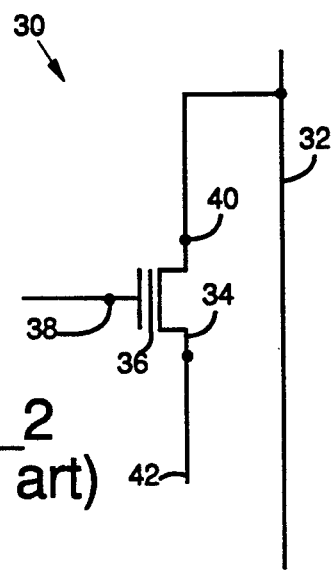
Fig_2
(prior art)
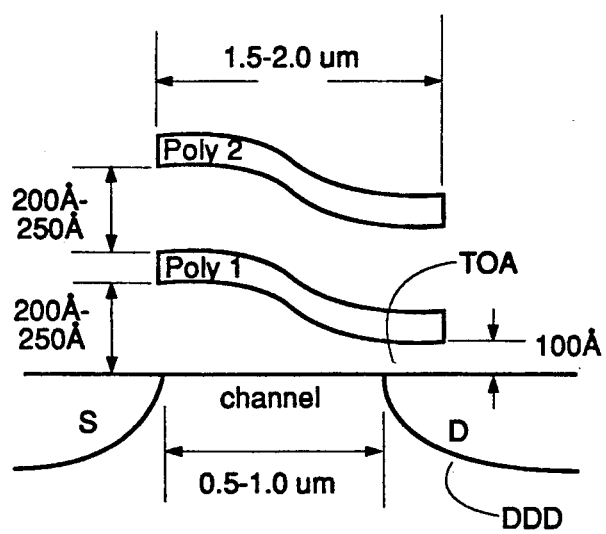
Fig_5(a)
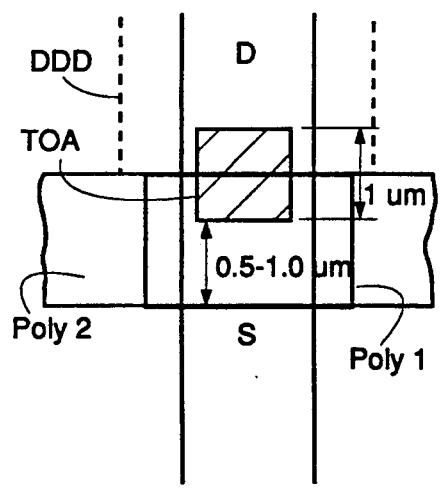
Fig_5(b)

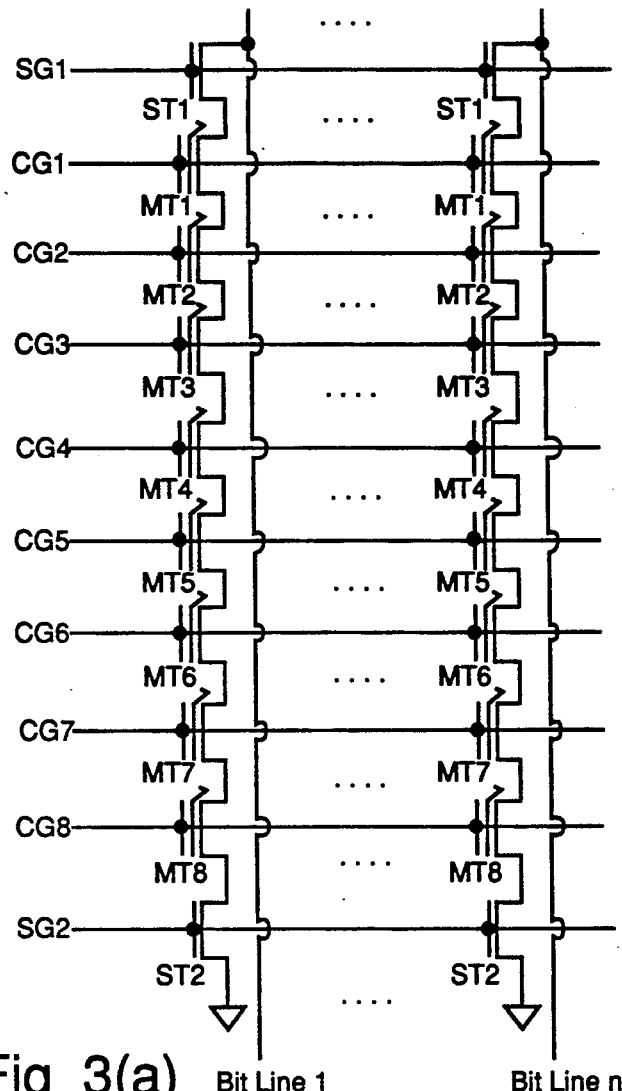
Fig_3(a)
(prior art)
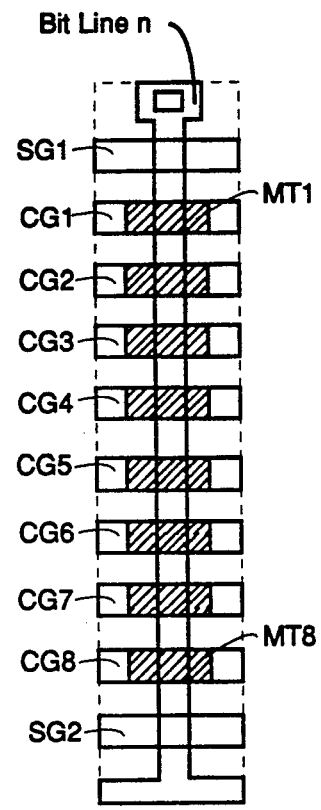
Fig_3(b)
(prior art)
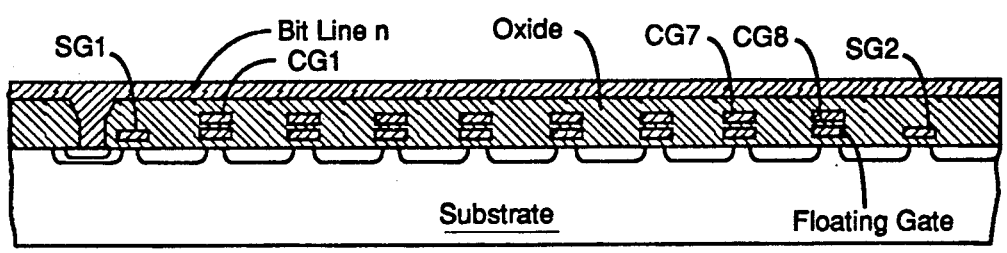
Fig_3(c)
(prior art)

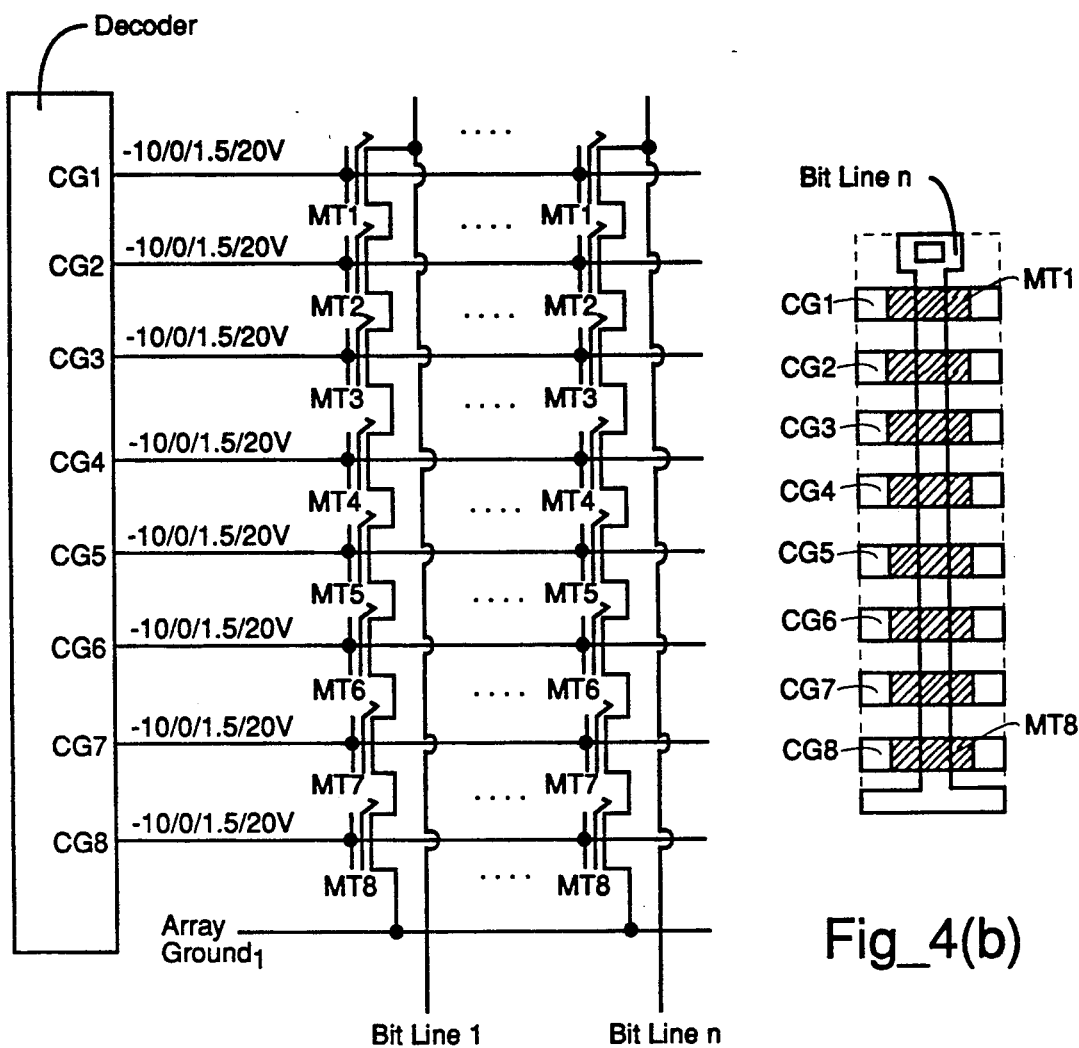
Fig_4(a)
Fig_4(b)
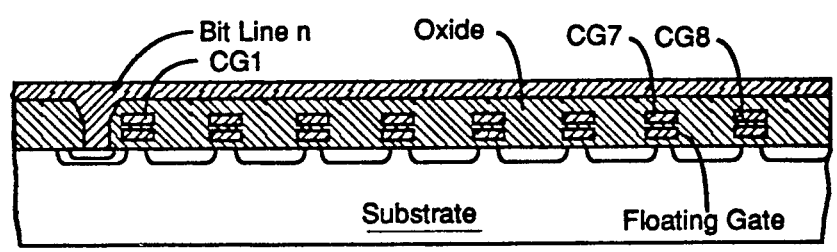
Fig_4(c)

SINGLE TRANSISTOR EEPROM ARCHITECTURE

BACKGROUND OF THE INVENTION

1. Field of the Invention

The invention relates generally to nonvolatile computer memory devices and more specifically to very high density devices made possible by using one, as opposed to two, transistors per memory cell.

2. Description of the Prior Art

Electrically programmable read only memory (EPROM) cells are among the smallest memory cells in the prior art. Electrically erasable EPROMs (called E$^2$PROMs) traditionally have had larger cell sizes because two transistors were necessary for each memory cell. Some so called "flash" EPROMs also have cells as small as EPROMs. Flash memories sort themselves into two basic approaches, distinguished by whether they require one or two voltage supplies. (See, Samuel Weber, "Look Out, Here Comes Flash," *Electronics*, November 1990, pp. 44–50.) These designs also differ in their cell structure—whether they require one or several transistors per cell. Intel Corporation (Santa Clara, Calif.) has a one-transistor self-aligned stacked-gate cell, based on its proprietary ETOX (EPROM tunnel-oxide) technology. Intel recently announced a very high density flash device, the 28F020, that stores two megabits. Catalyst, Excel, Hitachi, Mitsubishi, and Toshiba all offer competing devices. A problem with the the single-transistor cell is the possibility of over-erasure and consequent current leakage. This can result in false data readings when a cell in the zero state receives an erase pulse that drives it into the depletion mode. The column-sense amplifier will read this incorrectly as an erased cell. Intel, and others, have overcome this with a programming algorithm that first programs up all the cells on a chip to a "one" before erasing. Seeq Technology (San Jose, Calif.) solves the problem by using a different cell structure. A split-gate cell amounts to a two-transistor architecture, but takes only a little more chip area than a single transistor cell. (According to Weber, supra.) Through a diffusion process, the split-gate creates a phantom transistor that looks like a series transistor. This allows the cell to be isolated from others in a column. The Seeq devices (e.g., 48F512 and 48F010) have the ability to do sector-erase of any of 128 columns.

FIG. 1 illustrates a typical EEPROM memory cell 10 of the prior art comprising a bit line 12, a select transistor 14, a floating gate transistor 16 having a floating gate 18 and a control gate 20, a select gate 22 connected to a word line 24, and an array source 26. Transistor 16 is a floating-gate avalanche-injection metal oxide semiconductor (FAMOS) and is well known in the prior art. (For a background of these devices see, U.S. Pat. No. 4,884,239, issued Nov. 28, 1989, to Ono, et al.) To erase cell 10, a high voltage (about 20 V) is placed on gates 20 and 22, while array source 26 and bit line 12 are at ground. The high voltage on gate 20 is coupled to floating gate 18 by virtue of capacitive coupling. The voltage on gate 18 is a function of the coupling ratio gamma. (Depending on the technology used, the coupling ratio will vary, and so will the voltages used.) Therefore $V_{18} = \text{gamma} * V_{20}$. Once $V_{18}$ reaches a critical level (typically ~11 V) the field across the tunnel oxide area of transistor 16 is enough to start electron tunneling from the drain of transistor 16 to gate 18 through the thin (~100 Å) tunnel oxide. This results in a relatively high threshold voltage ($V_{th}$) for transistor 16. To program cell 10, control gate 20 is grounded, high voltages (~20 V) are placed on bit line 12 and select gate 22, while array source 26 is left to float. The high voltage on bit line 12 transfers through transistor 14 to the drain of transistor 16. An electric field is produced across the tunnel oxide area of transistor 16 to start tunneling of electrons in the direction opposite to the above. This results in transistor 16 having a low threshold voltage ($V_{th}$, which can be $-2$ V to $-3$ V). This threshold voltage is the reason that transistor 14 is needed in read mode because transistor 16 cannot be reliably controlled for reading by gate 20. Since a high voltage on only one terminal, control gate 20 or the drain of transistor 16, is needed to program and erase, the select gate 22 is needed for these modes.

FIG. 2 illustrates a prior art single-transistor flash EPROM memory cell 30 comprising a bit line 32 and a memory transistor 34 having a floating gate 36, a control gate 38 connected to a word line, a drain 40, and an array ground 42. To erase cell 30, control gate 38 and bit line 32 have a high voltage (~12 V to 15 V) applied. This puts transistor 34 in a high current mode drawing about one milliamp from bit line 32 to array ground 42. Hot electrons are generated and get trapped in floating gate 36. (This is the standard EPROM programming mode.) To program cell 30, control gate 38 is grounded and array ground 42 is at high voltage. Bit line 32 is floating and electrons tunnel through the thin gate oxide of transistor 34 to array ground 42. This results in a low $V_{th}$ state for transistor 34.

A pass transistor can prevent memory cells from drawing current when the floating gate structure is erased into depletion. (See, Gill, et al., "A 5-Volt Contactless Array 256KBIT Flash EEPROM Technology," IEDM 88, IEEE, pp. 428–431.) Such pass, or read select, transistors are routinely used in the prior art. A contactless cell array technology is described by Gill, et al. (supra), for a single power supply 5 V-only flash EEPROM. The contactless flash EEPROM cell is a one-transistor floating gate structure (defined by double poly stack process) merged with a series enhancement pass gate. The cell erase is accomplished by Fowler-Nordheim tunneling from floating gate to source junction by applying a negative voltage on the word line and Vcc=5 V on the source line (Id., FIG. 4). There is no significant change in the erased state threshold voltage because of the merged pass gate. Since the floating gate structure can be over-erased into depletion, the cell $V_{th}$ is dominated by the pass gate characteristics.

The prior art has developed a method of combining eight memory transistors in a bank having only two select transistors. These structures save as many as six transistors in an eight-bit memory bank, and are known as NAND structure cells. (See, Momodomi, et al., "New Device Technologies for 5 V-Only 4 Mb EEPROM With NAND Structure Cell," IEDM 88, 1988, pp. 412–415 [ULSI Research Center, Toshiba Corp., Japan].) NAND structure cells have been nominated as the most promising ultra high density EEPROM that is capable of replacing magnetic memories, such as floppy disk. By using one micron design rules, cell units as small as 12.9 square microns per bit are possible, which is good enough to fabricate a 4 Mb EEPROM. A Toshiba paper presented to the 1990 IEDM conference, revealed an experimental 16 Mb NAND EEPROM having a bit cell area that has been squeezed down to 2.3 square microns. (Bursky, et al., "IEDM Unveils the Latest Semiconductor Advances," *Electronic Design*, Vol. 38, No. 22, Nov. 22, 1990, pp. 39-51.) The new, smaller cell is reported to have used a new self-aligned stacked-gate pattern, a new high-voltage field isolation technology, and a larger NAND string of sixteen memory bits. The main features of the NAND structure cell are that they have a wide threshold voltage window achieved by a new programming operation, and tolerate successive program/erase operations by using high voltage CMOS processes.

FIG. 3(a) shows a NAND structure of eight memory transistors MT1-MT8, having respective control gates CG1-CG8, connect their drains and sources in series with one another and two select transistors ST1-ST2 having select gates SG1-SG2. FIG. 3(b) is a layout of the NAND structure of FIG. 3(a) and FIG. 3(c) is a cross-sectional view of the layout. The process and device parameters are given in Table I.

TABLE I

| Technology | N-Well CMOS | |
| --- | --- | --- |
| | Triple Level Poly-Si | |
| | Single Aluminum Layer | |
| Gate Length | Memory Cell | 1.0 micron |
| | Select Gate | 1.5 micron |
| | NMOS | 2.0 micron |
| | PMOS | 2.5 micron |
| Oxide Thickness | Transistor | 400 Å |
| | Memory Cell | 100 Å |

Select transistor SG1 ensures the selectivity, and SG2 prevents current from passing during programming operation. (Momodomi, et al., supra.) Each memory cell has therefore only one memory transistor, a quarter of a select transistor, and a sixteenth of a contact hole area per bit. The NAND structure can be fabricated by conventional self-aligned double poly silicon gate technology. A typical 4 Mb EEPROM is composed of 256×2048 NAND structure cell arrays.

In the NAND structure described by Momodomi, et al., (supra) the cell is programmed and erased by Fowler-Nordheim tunneling. The current dissipation during these operations is therefore very small. To erase, 17 V is applied to the control gates while the bit lines are grounded. All cells in a block are erased simultaneously. The threshold voltage ($V_{th}$) of erased cells becomes an enhanced mode at approximately 2 V after one millisecond erasing time. To program, 22 V is applied to the nonselected control gates and the selected bit lines, while the selected control gate is grounded. Half of the programming voltage (11 V) is applied to the nonselected bit lines in order to keep the $V_{th}$ of the nonselected cells.

U.S. Pat. No. 4,959,812, issued Sep. 25, 1990, to Momodomi, et al., describes an erasable programmable read-only memory with NAND cell structure which has memory cells provided on an n-type substrate. The memory cells are divided into NAND cell blocks each having a series array of memory transistors. Each of the transistors has a floating gate, a control gate connected to a word line and n-type diffusion for the source and drain. These diffusions are formed in a p-type well in the surface of the substrate. The well serves as a surface breakdown prevention layer. During a data erase, data stored in all of the memory cells is erased simultaneously. During data write, which is subsequent to erase, a certain NAND cell is selected and memory transistors within the NAND cell block are written in a hierarchical sequence. (Unprogrammed cells nearer the selection transistor interfere with the writing operation.) When data is written, the respective control gate is supplied with a voltage high enough to form an electric field that will promote tunneling of electrons between the floating gate of the memory transistor and the well layer. Consequently, only the selected cell is written into.

An "EEPROM Device with Plurality of Memory Strings Made of Floating Gate Transistors Connected in Series" is the subject of U.S. Pat. No. 4,962,481, issued Oct. 9, 1990, to Jung-Hyuk Choi, et al. This device has a plurality of memory strings arranged in a single column respectively disposed at both sides of each column line and an upper and lower row between reference lines. A single select transistor is used in each string.

The disadvantages of the prior art for EEPROM are that select transistors are needed, making high density difficult, and bit lines have high voltages on them causing spacing concerns between adjacent lines. In flash EPROMs the problems are again high voltages being placed on bit lines, high currents needed to program memory cells, and a loss of the page mode of operation because too much current is needed. Often, the write operation can produce negative thresholds and complicated algorithms are necessary to work around the problem.

SUMMARY OF THE PRESENT INVENTION

It is therefore an object of the present invention to eliminate the necessity for select transistors in an EEPROM device and to return the real estate on the chip thus saved to the main purpose of storing more data.

Briefly, a single-transistor EEPROM device of the present invention comprises memory transistors in banks similar to NAND structures wherein the control gates of the memory transistors have negative voltages applied in various modes that allow reading, writing, and programming regardless of the $V_{th}$ of nonselected memory transistors in a bank. Programming and erasing results from various combinations of negative and positive voltages are used on the select gates together with positive voltages less than that alone which is necessary to induce Fowler-Nordheim tunneling are applied to the bit lines.

An advantage of the present invention is that very high density EPROM devices are possible that have the programming and reading simplicity of E²PROM devices.

Another advantage of the present invention is that lower voltages are used and smaller device geometries may be used.

Another advantage of the present invention is that select transistors are eliminated.

Another advantage of the present invention is that the need to submit a flash memory cell to a high current hot electron injection mode is eliminated, thus reducing overall programming current.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a schematic diagram of a prior art E²PROM memory cell;

FIG. 2 is a schematic diagram of a prior art EPROM or FLASH memory cell;

FIG. 3(a) is a schematic diagram, FIG. 3(b) is a layout, and FIG. 3(c) is a cross-sectional diagram of a prior art NAND structure;

FIG. 4(a) is a schematic diagram, FIG. 4(b) is a layout, and FIG. 4(c) is a cross-sectional diagram of a NAND structure of the present invention; and FIG. 5(a) is a cross-section and FIG. 5(b) is a layout of a preferred memory transistor for the NAND structure of FIGS. 4(a)–(c).

DETAILED DESCRIPTION OF THE PREFERRED EMBODIMENTS

FIG. 4 illustrates a pair of NAND structures of the present invention. A first and an "nth" NAND structure are shown. Each NAND structure consists of eight memory transistors MT1–MT8 connected in series (drain-to-source) with the top end of the string connected to a bit line and the bottom end of the string connected to ground. Each memory transistor has a source, a drain, a control gate respectively connected to CG1–CG8, and a floating gate. The gate oxide between the floating gate and channel between the drain and source is approximately 100 Å. This thickness is such that tunneling of charge can take place between the floating gate and drain. The drain diffusion is such that there is an under-lap below the floating gate. Thus the tunnel window of this memory transistor is the area between the floating gate and the under-lap drain diffusion. An isolated charge on the floating gates determines the threshold voltage ($V_{th}$), +2 V or −2 V, of the respective memory transistors, and as such is the basic mechanism for storing the data. Fowler-Nordheim tunneling is used to both erase and write data (charges) into the floating gate. Four voltage levels are possible on each of the control gates CG1–CG8, these are −10 V, 0 V, 10 V, and 20 V. Three voltages can be applied to the bit line, 0 V, 1.5 V, and 5 V. The appropriate voltages to apply to CG1–CG8 and the bit lines depends on the mode, whether erase, write, or read, and whether the NAND structure is selected or not. These voltages are summarized in Table II for the exemplary case of erasing, writing, and reading MT4 in the NAND structure in the first column connected to bit line one. Table III shows the conditions existing for nonselected NAND structures.

TABLE II

| Control | Condition | ERASE | WRITE | READ |
|---|---|---|---|---|
| Bit Line₁ | selected | 0V | 5V | 1.5V |
| CG1 | off | 5V | 10V | 5V |
| CG2 | off | 5V | 10V | 5V |
| CG3 | off | 5V | 10V | 5V |
| CG4 | selected | 20V | −10V | 0V |
| CG5 | off | 5V | 10V | 5V |
| CG6 | off | 5V | 10V | 5V |
| CG7 | off | 5V | 10V | 5V |
| CG8 | off | 5V | 10V | 5V |
| array ground₁ | selected | 0V | 5V | 0V |

The selected memory transistor will have, as its drain voltage, the voltage of the bit line which is passed through by the nonselected memory transistors. The threshold voltage $V_{th}$ for erase is +2 V and −2 V for write. To erase a memory cell, e.g., MT4 on bit line one, CG4 is raised to 20 V, CG1–CG3 and CG5–CG8 are set to 5 V, and bit line one is grounded. Placing 5 V on CG1–CG3 and CG5–CG8 turns on MT1–MT3 and MT5–MT8 and their respective drain-to-source resistances drop to a low ON value. Since both ends of the NAND structure string are at 0 V, then the source and drain of MT4 will be at 0 V. The difference across the control gate and drain of MT4 will be about 20 V, more than enough to cause Fowler-Nordheim tunneling of electrons from the drain to the floating gate of MT4. The $V_{th}$ of MT4 will therefore become +2 V (the programming time is also adjusted to guarantee this also). The charge assumed by the floating gate will partly depend on the capacitive coupling ratio, gamma, where $$gamma = C_1/(C_1 + C_2) \quad (1)$$

(Where the capacitance between the control gate and floating gate is C1, and the capacitance between the floating gate and drain+source+substrate is C2.) Preferably, gamma will be in the range 0.50 to 0.55. The coupling ratio and the programming time are adjusted such that ±10 V on the control gate and 0 V on the drain will not cause an appreciable change in $V_{th}$. If the control gate voltage is $V_{cg}$, and the floating gate voltage is $V_{fg}$, then $$V_{cg}*(C_1/(C_1+C_2)) = V_{fg} \quad (2)$$

Since the onset of Fowler-Nordheim tunneling depends on an adequate voltage on the floating gate, the actual voltages given in Tables II and III will be directly controlled by the coupling ration gammas of the memory transistors. And so the above voltages are only exemplary, and not to be considered absolute. The better the coupling ratio gamma, the lower can be the programming voltage on the control gates. Transistors MT1–MT3 and MT5–MT8 do not erase because their control gates have only 5 V applied. Transistors MT1–MT8 in the $n^{th}$ column connected at the top end to bit line "n" do not erase because bit line "n" is floating. The write operation is just the opposite. Plus 10 V is applied to the control gates of MT1–MT3 and MT5–MT8 to bias them ON in view of the fact bit line one is raised to 5 V. Plus 5 V therefore couples through the series string to the drain of MT4. Control gate CG4 has a −10 V applied which will cause Fowler-Nordheim tunneling in the reverse direction (compared to erasing). The $V_{th}$ of MT4 will become −2 V as a result (the programming time is also adjusted to guarantee this also). For reading, the selected bit line is set to 1.5 V and the selected control gate (CG4) to 0 V. The other control gates are set to 5 V so that their respective transistors are ON (regardless of their respective $V_{th}$) and the $V_{th}$ of MT4 will control whether MT4 is ON or OFF (because the control gate set to 0 V will not override $V_{th}$). If MT4 is ON, the voltage of the array ground will couple through, otherwise the sense voltage of 1.5 V on bit line one will be read as a high (MT4 OFF).

In Table III, nonselected bit lines are set to floating, floating, and 0 V, respectively, for erase, write, and read. Non-selected array grounds are also set to 0 V, 0 V, and 0 V, respectively for erase, write, and read. This ensures that a NAND structure string on a nonselected bit line and a selected array ground, and/or a NAND structure string on a selected bit line and a nonselected array ground, will not be erased, written, or read, in sympathy with the selected NAND structure string. A NAND structure string on a nonselected bit line and a nonselected array ground will, of course, be doubly isolated.

TABLE III

| Control | Condition | ERASE | WRITE | READ |
|---|---|---|---|---|
| Bit Line$_n$ | off | floating | floating | 0V |
| CG9 | off | 0V | 0V | −3V |
| CG10 | off | 0V | 0V | −3V |
| CG11 | off | 0V | 0V | −3V |
| CG12 | off | 0V | 0V | −3V |
| CG13 | off | 0V | 0V | −3V |
| CG14 | off | 0V | 0V | −3V |
| CG15 | off | 0V | 0V | −3V |
| CG16 | off | 0V | 0V | −3V |
| array ground$_n$ | off | 0V | 0V | 0V |

FIG. 5 illustrates an improved memory transistor having a source, a drain, a channel in between the source and drain, a floating gate (alternatively called "poly 1"), silicon dioxide dielectric, and a control gate (alternatively called "poly 2"). The drain is a deep diffusion drain (DDD). The diffused junction area under the tunnel implant area (also called TOA) is typically formed by a special tunnel implant which is not self-aligned to the polysilicon gate (as a normal source or drain would be). But is implanted using a special masking step such that a diffused junction is formed under the floating gate. The control gate is separated from the floating gate by 200 Å–250 Å of silicon dioxide. The capacitance between the two gates is referred to below as $C_1$. The floating gate is separated from the channel/drain by 200 Å–250 Å at one end and 100 Å at the other end. The 100 Å area that the floating gate overlaps the drain is the tunnel oxide area (TOA). The capacitance between the floating gate and the channel/drain/source is referred to below as $C_2$.

The memory transistor of FIGS. 5(a)–(b) is preferred for use in the NAND structure of FIGS. 4(a)–(c) because it simultaneously achieves a small cell geometry, on the order of 1.5 microns, and has a high coupling capacitance ratio gamma of 0.50 to 0.55. Higher gammas allow lower programming voltages because more of the programming voltage will couple to the floating gate. About 11 V is needed to support Fowler-Nordheim tunneling in a 100 Å thick tunnel oxide area. Given a maximum programming voltage of 20 V, the gamma must be 0.55 (applying formulas one and two, above). Capacitance $C_2$ must therefore be no greater than $C_1$. The capacitance between two plate, given a fixed dielectric between them, increases when the plates are brought closer together or when the area of the plates is increased, or both. Increasing the capacitance of $C_1$ by increasing the size of the gates runs contrary to goal of having small cell sizes. Increasing the capacitance of $C_1$ by decreasing the distance between the gates will cause problems because the programming voltage on the control gate could breakdown the oxide between the gates. Decreasing the capacitance of $C_2$ seems to be the only alternative. However, the distance from the floating gate to the channel/drain cannot be increased, because the tunnel oxide area (TOA) must be 100 Å thick for tunneling to occur.

The solution, shown in FIGS. 5(a)–(b) is to have the floating gate droop from 200 Å–250 Å over the channel to 100 Å over the drain. The control gate follows this droop to avoid a decrease in capacitance $C_1$ that would result otherwise. The TOA is preferably one micron square, with half of that area extending over the drain. With a channel width of one half to one micron, the technology is not pushed in terms of lithography, but effectively a transistor with a half micron channel length and half micron tunnel oxide is realized. The TOA is such that only half of it is actually under "Poly 1". This way a small area for the TOA is achieved at the same time facilitating a TOA for the cell without pushing the state of the art in lithography. The deep diffusion drain (DDD) can alternatively be such that the resulting drain under-laps the "Poly 1" in the TOA. The channel area is alternatively such that the drain and TOA overlap on one side and the source diffusion on the other side.

Referring once again to FIG. 4(a), the source and drain of alternating transistors (e.g., MT1–MT8) can be reversed such that drain connects to drain and source connects to source. Such a configuration has the advantage of being able to be packed much closer together, thus resulting in smaller overall device real estate.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A memory device, comprising:
   a plurality of strings each having a plurality of memory transistors with their sources and drains connected in series, each memory transistor having a respective source, drain, channel, control gate, and floating gate;
   a plurality of bit lines each having a respective string connected at one end of the string to the bit line, the bit lines connected to respective sensing amplifiers;
   a decoder having a plurality of outputs respectively connected to said control gates of said memory transistors within their respective strings, the decoder having both negative and positive voltage outputs;
   means for erasing such that a selected memory transistor will have its floating gate charged in a first direction by Fowler-Nordheim tunneling to a value that causes the $V_{th}$ of the memory transistor to be approximately +2 V;
   means for writing such that a selected memory transistor will have its floating gate charged in a second direction by Fowler-Nordheim tunneling to a value that causes the $V_{th}$ of the memory transistor to be approximately −2 V; and
   means for reading such that a selected memory transistor will be responsive to said control gate when $V_{th}$ is within the range of approximately −2 V to +2 V.

2. The device of claim 1, wherein:
   the strings are arranged in a plurality of columns and rows such that strings in a common row are tied to one of a plurality of array grounds, and arranged such that strings in a common column are connected at the end opposite the array ground to one of the bit lines.

3. The device of claim 1, wherein during an erase operation:
the decoder outputs approximately +5 V on nonselected control gates and +20 V on a selected control gate; and
the bit line for a selected string is approximately 0 V.

4. The device of claim 1, wherein during a write operation:
the decoder outputs approximately +10 V on nonselected control gates and −10 V on a selected control gate; and
the bit line for a selected string is approximately +5 V.

5. The device of claim 1, wherein during a read operation:
the decoder outputs approximately +5 V on nonselected control gates and 0 V on a selected control gate; and
the bit line for a selected string is approximately +1.5 V.

6. The device of claim 1, wherein during an erase operation:
the bit line for a selected string is grounded; and
the decoder outputs a voltage on the nonselected control gates sufficiently positive to turn on all nonselected memory transistors in a string and outputs a voltage on a selected control gate sufficiently positive to sustain Fowler-Nordheim tunneling to cause the $V_{th}$ of the selected memory transistor to reach approximately +2 V.

7. The device of claim 1, wherein during a write operation:
the bit line for a selected string is raised to a voltage sufficiently positive to sustain Fowler-Nordheim tunneling to cause the $V_{th}$ of the selected memory transistor to be approximately −2 V; and
the decoder outputs (a) a voltage on the nonselected control gates sufficiently positive in view of the bit line voltage to turn on all nonselected memory transistors in a string, and (b) outputs a voltage on a selected control gate sufficiently negative to sustain Fowler-Nordheim tunneling to cause the $V_{th}$ of the selected memory transistor to be approximately −2 V.

8. The device of claim 1, wherein during a read operation:
the bit line for a selected string is approximately +1.5 V; and
the decoder outputs a voltage on the nonselected control gates sufficiently positive to turn on all nonselected memory transistors in a string and grounds a selected control gate, such that the selected memory transistor will conduct if $V_{th}$ is approximately +2 V and will not conduct if $V_{th}$ is approximately −2 V, said $V_{th}$ dependent on previous erasing and writing operations.

9. The device of claim 1, wherein:
said floating gates droop over the area of said drain to less than one half the height of the the opposite end of said floating gate over the channel, said control gate droops in a manner similar to said floating gate and is equidistant from said floating gate.

10. The device of claim 9, wherein:
the memory transistors have a capacitive coupling ratio gamma in the range of approximately 0.50 to 0.55.

11. A memory device, comprising:
a plurality of memory transistors having their sources and drains connected in series, each memory transistor having a respective source, a deep diffusion drain, a channel, a control gate, a floating gate comprising a polysilicon layer, and a tunnel oxide area able to support Fowler-Nordheim tunneling between said floating gate and drain, said tunnel oxide area such that about half of it is under said polysilicon layer wherein a relatively small area for said tunnel oxide area is made possible without exceeding predetermined lithography rules.

12. The memory device of claim 11, wherein:
said deep diffusion drain is adjacent to said channel and diffused under said floating gate such that said diffusion drain under-laps said polysilicon layer in the tunnel oxide area.

13. A memory transistor, comprising:
a control gate;
a floating gate disposed under the control gate;
a tunnel oxide area having an oxide thickness able to sustain Fowler-Nordheim tunneling disposed under the floating gate;
a source;
a channel adjacent to the source and disposed under the floating gate such that a first part of a tunnel oxide area is between the channel and the floating gate; and
a deep diffusion drain adjacent to the channel and diffused under the floating gate such that a second part of the tunnel oxide area is between the deep diffusion drain and the floating gate.

14. The transistor of claim 13, wherein:
said first and second parts of the tunnel oxide area are about equal in area and both together comprise about all of the tunnel oxide area, the second part sustaining substantially all the Fowler-Nordheim tunneling of the transistor while the first part sustains substantially no Fowler-Nordheim tunneling.

15. The transistor of claim 13, wherein:
the floating gate has a first altitude over the source, a second altitude over the channel, and a third altitude over the drain, the altitudes such that the first is greater than the second, and the second is greater than the third.

16. The transistor of claim 15, wherein:
the control gate is substantially parallel to the floating gate.

17. The transistor of claim 15, wherein:
the capacitive coupling ratio of the control and floating gates with the channel and drain is within the range of 0.50 to 0.55.

18. The transistor of claim 13, wherein:
the tunnel oxide area is approximately 100 Å thick and ranges from the area of the channel across the interface of the channel with the deep diffusion drain and then ranges into the area of the drain, such that smaller memory cell comprising the memory transistor may be obtained with a given limitation in semiconductor process lithography.

19. A memory device, comprising:
a plurality of memory transistors, each memory transistor having a respective source, a deep diffusion drain, a channel, a control gate, a floating gate comprising a polysilicon layer, and a tunnel oxide area able to support Fowler-Nordheim tunneling between said floating gate and drain, said tunnel oxide area such that about half of it is under said polysilicon layer wherein a relatively small area for said tunnel oxide area is made possible without exceeding predetermined lithography rules, and at least one portion of the plurality of memory transistors connected in series such that a drain of a memory transistor is connected to the drain of an adjacent memory transistor and a source of one memory transistor is connected to the source of an adjacent memory transistor.

* * * * *